US012672230B2

(12) United States Patent
Tanimukai et al.

(10) Patent No.: US 12,672,230 B2
(45) Date of Patent: Jun. 30, 2026

(54) SUBSTRATE STRUCTURE

(71) Applicant: DAIKIN INDUSTRIES, LTD., Osaka (JP)

(72) Inventors: Kazuma Tanimukai, Osaka (JP); Masaki Kono, Osaka (JP); Hirotaka Doi, Osaka (JP); Reiji Kawashima, Osaka (JP); Yuki Nakajima, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 315 days.

(21) Appl. No.: 18/622,921

(22) Filed: Mar. 30, 2024

(65) Prior Publication Data

US 2024/0251502 A1    Jul. 25, 2024

Related U.S. Application Data

(63) Continuation of application No. PCT/JP2022/035895, filed on Sep. 27, 2022.

(30) Foreign Application Priority Data

Sep. 30, 2021    (JP) ................................. 2021-161386

(51) Int. Cl.
H05K 1/02        (2006.01)
H05K 1/14        (2006.01)
H05K 1/181       (2026.01)

(52) U.S. Cl.
CPC ........... H05K 1/0277 (2013.01); H05K 1/144 (2013.01); H05K 1/181 (2013.01);
(Continued)

(58) Field of Classification Search
CPC ........... H05K 1/0271; H05K 2201/042; H05K 1/144; H05K 3/381
See application file for complete search history.

(56) References Cited

U.S. PATENT DOCUMENTS

2011/0100692 A1    5/2011  Topacio et al.

FOREIGN PATENT DOCUMENTS

JP        3-17683 U       2/1991
JP        2003-264354 A   9/2003
(Continued)

OTHER PUBLICATIONS

European Search Report of corresponding EP Application No. 22 87 6208.4 dated Nov. 5, 2024.
(Continued)

*Primary Examiner* — Timothy J Thompson
*Assistant Examiner* — John B Freal
(74) *Attorney, Agent, or Firm* — Spencer Fane LLP

(57)        ABSTRACT

A substrate structure includes a first substrate with a plurality of chip parts including a first chip part mounted, and a second substrate connected to the first substrate. The first chip part has a strain equal to or more than a predetermined value, which is from 500 μST to 4000 μST, in a non-connected state in which the second substrate is not connected to the first substrate and the first substrate is supported at two predetermined points. The strain of the first chip part is equal to or less than the predetermined value in a connected state in which the second substrate is connected to the first substrate and the first substrate is supported at the two predetermined points.

20 Claims, 2 Drawing Sheets

(52) U.S. Cl.
    CPC .............. *H05K 2201/10015* (2013.01); *H05K*
            *2201/10022* (2013.01); *H05K 2201/1003*
            (2013.01); *H05K 2201/2009* (2013.01)

(56)                    References Cited

FOREIGN PATENT DOCUMENTS

JP          2021-81207  A      5/2021
WO          2020/157793  A1     8/2020

OTHER PUBLICATIONS

International Preliminary Report of corresponding PCT Application
No. PCT/JP2022/035895 dated Apr. 11, 2024.
International Search Report of corresponding PCT Application No.
PCT/JP2022/035895 dated Dec. 20, 2022.

SUBSTRATE STRUCTURE

CROSS-REFERENCE TO RELATED APPLICATIONS

This is a continuation of International Application No. PCT/JP2022/035895 filed on Sep. 27, 2022, which claims priority to Japanese Patent Application No. 2021-161386, filed on Sep. 30, 2021. The entire disclosures of these applications are incorporated by reference herein.

BACKGROUND

Technical Field

The present disclosure relates to a substrate structure including a first substrate with a plurality of chip parts mounted and a second substrate connected to the first substrate.

Background Art

Japanese Utility Model Publication No. H3-17683 discloses a substrate structure including a substrate with a flyback transformer mounted. In this substrate structure, a reinforcing part having a cantilever support reinforces the substrate to keep the substrate from cracking.

SUMMARY

A first aspect of the present disclosure is directed to a substrate structure including a first substrate with a plurality of chip parts including a first chip part mounted, and a second substrate connected to the first substrate. The first chip part has a strain equal to or more than a predetermined value, which is from 500 μST to 4000 μST, in a non-connected state in which the second substrate is not connected to the first substrate and the first substrate is supported at two predetermined points. The strain of the first chip part is equal to or less than the predetermined value in a connected state in which the second substrate is connected to the first substrate and the first substrate is supported at the two predetermined points.

DETAILED DESCRIPTION OF EMBODIMENT(S)

Embodiments of the present disclosure will be described below with reference to the drawings.

Figure 1:
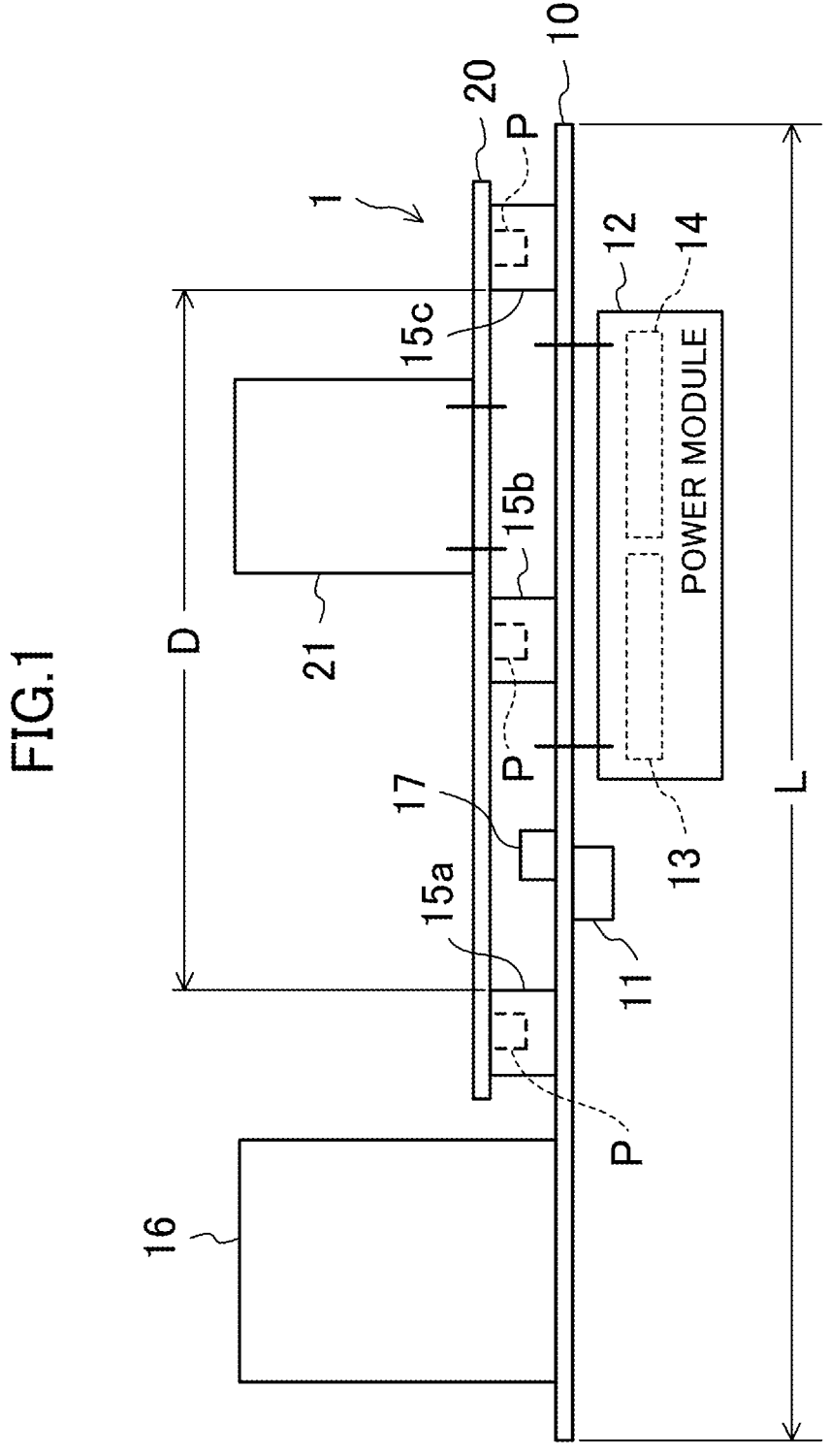
FIG. 1 is a front view of a power converter to which a substrate structure of the present disclosure is applied.

FIG. 1 shows a power converter (1) to which a substrate structure of the present disclosure is applied. The power converter (1) includes first and second substrates (10, 20) parallel to each other. The whole second substrate (20) overlaps with part of the first substrate (10).

Figure 2:
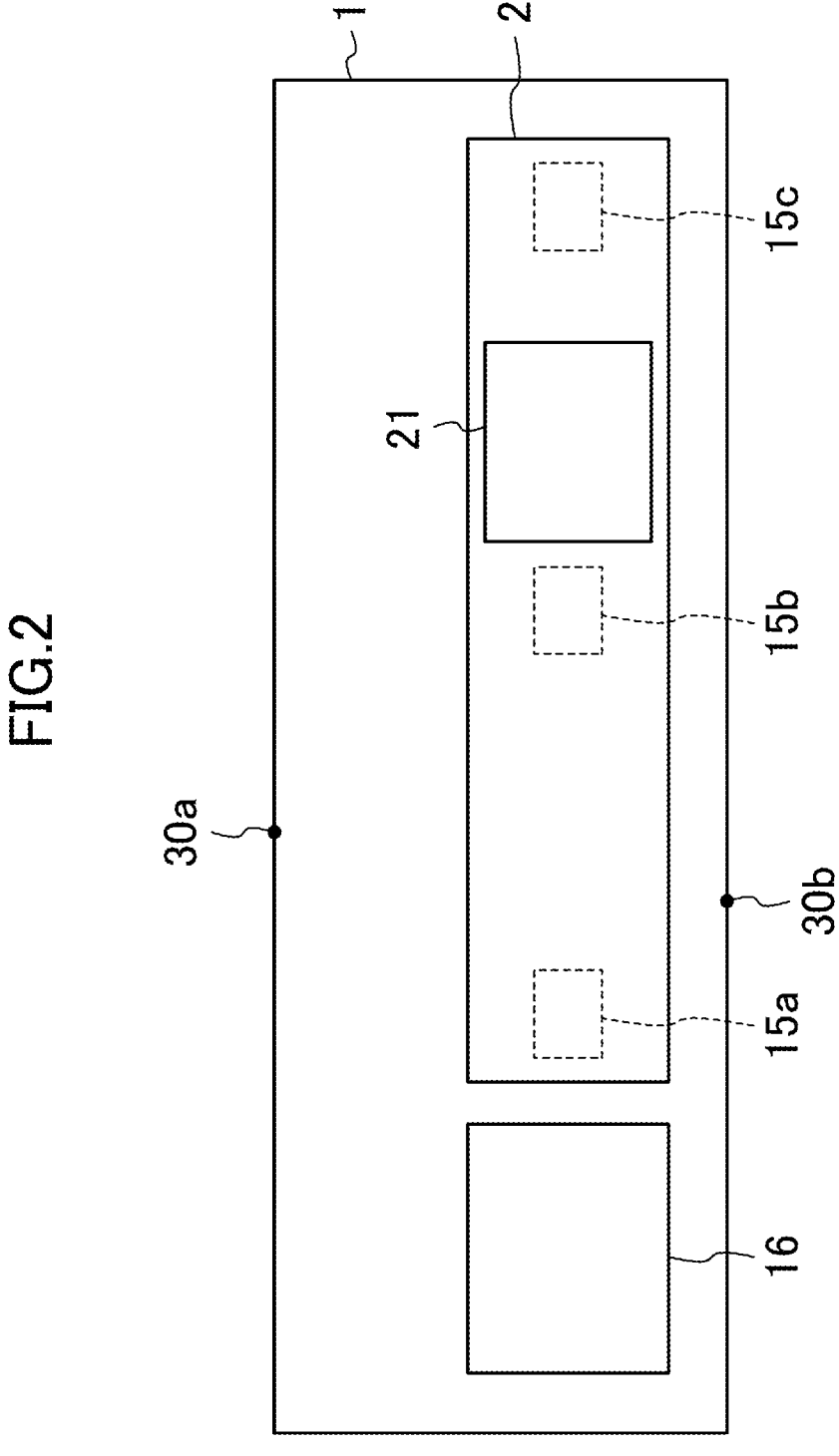
FIG. 2 is a plan view of the power converter to which the substrate structure of the present disclosure is applied.

As illustrated in FIG. 2, the first substrate (10) has a rectangular shape in plan view. Chip parts including first and second chip parts (11, 17) (other chip parts are not shown) are mounted on the surfaces of the first substrate (10). The first chip part (11) is mounted on one of the surfaces of the first substrate (10), and the second chip part (17) is mounted on the other surface of the first substrate (10). A power module (12) including a converter circuit (13) and an inverter circuit (14) is through-hole mounted on the one surface of the first substrate (10). The first chip part (11) may be mounted on either surface of the first substrate (10). The converter circuit (13) converts AC power from a power source into DC power and outputs the DC power. The inverter circuit (14) converts the DC power into AC power. The converter circuit (13) and the inverter circuit (14) constitute the power module (12). The power module (12) is arranged closer to one side in the longitudinal direction of the first substrate (10) than the first chip part (11). Two or more power modules (12) may be mounted on the first substrate (10). Specifically, a power module (12) including the converter circuit (13) alone and a power module (12) including the inverter circuit (14) alone may be mounted on the first substrate (10).

A reactor (16) that weighs 400 g or more is mounted on the other surface of the first substrate (10) to be closer to an end on the other side in the longitudinal direction of the first substrate (10). As illustrated in FIG. 2, the reactor (16) is positioned closer to one end in the lateral direction of the first substrate (10). The DC power outputted from the converter circuit (13) is supplied to the inverter circuit (14) via the reactor (16). The reactor (16) may be provided so that the AC power from the power source is supplied to the converter circuit (13) via the reactor (16). The reactor (16) is not necessarily arranged closer to the one end in the lateral direction of the first substrate (10). First to third connecting parts (15a to 15c) are mounted on the other surface of the first substrate (10) to be closer to the one side in the longitudinal direction of the first substrate (10) than the reactor (16). The first to third connecting parts (15a to 15c) are arranged at intervals in the longitudinal direction of the first substrate (10) in order from the side closer to the reactor (16). The first and third connecting parts (15a, 15c) are spaced apart from each other by a distance (D) of one third or more of the length (L) of the longest linear edge, i.e., an edge extending in the longitudinal direction, of the first substrate (10). The first to third connecting parts (15a to 15c) are positioned closer to the one end in the lateral direction of the first substrate (10). The first chip part (11) is spaced away from the first connecting part (15a) to the one side in the longitudinal direction of the first substrate (10), and is spaced away from the third connecting part (15c) to the other side in the longitudinal direction of the first substrate (10).

As illustrated in FIG. 2, the second substrate (20) has a rectangular shape smaller than the first substrate (10) in plan view. The second substrate (20) is arranged to face the surface of the first substrate (10) on which the first to third connecting parts (15a to 15c) are mounted to overlap with the first substrate (10) excluding part of the first substrate (10) closer to an end on the other side in the longitudinal direction (an end closer to the reactor (16)) and substantially half of the first substrate (10) closer to the other end in the lateral direction. The second substrate (20) is arranged to overlap with the first chip part (11) in the thickness direction without overlapping with the reactor (16) in the thickness direction.

The second substrate (20) may or may not be made of the same material as the first substrate (10). The X, Y, and Z directions of the material of the first substrate (10) may or may not be the same as the X, Y, and Z axis directions of the material of the second substrate (20). This configuration meets a condition that the second substrate (20) has a tensile modulus of elasticity in a first predetermined direction of 70% or more of a tensile modulus of elasticity of the first substrate (10) in a second predetermined direction and a condition that the second substrate (20) has a bending modulus of elasticity in a third predetermined direction of 70% or more of a bending modulus of elasticity of the first substrate (10) in a fourth predetermined direction. A difference between a coefficient of linear expansion of the first substrate (10) in a fifth predetermined direction and a coefficient of linear expansion of the second substrate (20) in a sixth predetermined direction is 30 ppm/K or less. When the first and second substrates (10, 20) are made of an isotropic material, the tensile modulus of elasticity of the second substrate (20) is 70% or more of the tensile modulus of elasticity of the first substrate (10) in any direction, reducing the concentration of stress on the second substrate (20). When the first and second substrates (10, 20) are made of an isotropic material, the difference in coefficient of linear expansion between the first and second substrates (10, 20) is 30 ppm/K or less in any direction. This can keep the first and second substrates (10, 20) from being stressed due to the difference in amount of displacement of the first and second substrates (10, 20) that expand or contract with temperature changes. When the first and second substrates (10, 20) are made of an anisotropic material, the X, Y, and Z directions of the material of the first substrate (10) and the X, Y, and Z axis directions of the material of the second substrate (20) are preferably the same. When the first and second substrates (10, 20) are made of the same material, it is easy to meet the conditions that: the tensile modulus of elasticity of the second substrate (20) in the first predetermined direction is 70% or more of the tensile modulus of elasticity of the first substrate (10) in the second predetermined direction; the bending modulus of elasticity of the second substrate (20) in the third predetermined direction is 70% or more of the bending modulus of elasticity of the first substrate (10) in the fourth predetermined direction; and the difference between the coefficient of linear expansion of the first substrate (10) in the fifth predetermined direction and the coefficient of linear expansion of the second substrate (20) in the sixth predetermined direction is 30 ppm/K or less.

The first to third connecting parts (15a to 15c) are connected to the second substrate (20) by press fitting with a press fitting member (P). That is, the second substrate (20) is connected to the first substrate (10) via the first to third connecting parts (15a to 15c). The first to third connecting parts (15a to 15c) may be connected to the second substrate (20) by screwing or soldering instead of the press fitting with the press fitting member (P). In this state, the first to third connecting parts (15a to 15c) are electrically connected to the second substrate (20).

A capacitor (21) connected between output terminals of the converter circuit (13) or between input terminals of the inverter circuit (14) is through-hole mounted on the surface of the second substrate (20) opposite to the first substrate (10). When the capacitor (21) is through-hole mounted on the surface of the first substrate (10) opposite to the surface on which the power module (12) is mounted, lead wires of the capacitor (21) and the power module (12) may easily interfere with each other, and an insulation distance between the lead wires and an insulation distance between wires having the same potential as the lead wires are likely to be insufficient. However, when the capacitor (21) is through-hole mounted on the second substrate (20), the interference between the lead wires and the shortage of the insulation distance can be avoided, and a wire connecting the capacitor (21) and the inverter circuit (14) can be easily shortened. The capacitor (21) is electrically connected to the inverter circuit (14) via the first to third connecting parts (15a to 15c).

The power converter (1) configured as described above is supported at two predetermined points apart from each other on one of the front or rear surface of the first substrate (10), two predetermined points apart from each other on an outer peripheral end surface of the first substrate (10), or two points in total including a point on one of the front or rear surface of the first substrate (10) and a point on the outer peripheral end surface of the first substrate (10). The two predetermined points are, for example, two points indicated by reference characters 30a and 30b shown in FIG. 2.

In the power converter (1) configured as described above, the first chip part (11) has a strain equal to or more than a predetermined value which is from 500 μST to 4000 μST inclusive in a non-connected state where the second substrate (20) is not connected to the first substrate (10) and the first substrate (10) is supported at the two predetermined points (30a, 30b), and the strain of the first chip part (11) is equal to or less than the predetermined value in a connected state where the second substrate (20) is connected to the first substrate (10) and the first substrate (10) is supported at the two predetermined points (30a, 30b). The predetermined value is preferably within the numerical range shown in Table 1 below depending on the type and size of the first chip part (11). When the predetermined value is within the numerical range shown in Table 1, the strain of the first chip part (11) having a guaranteed performance of no damage in the test of printed board bending resistance defined in section 8.5.1 of JIS C60068-2-21 (2009) can be made smaller than the predetermined value corresponding to the type and size of the first chip part (11) by connecting the second substrate (20) to the first substrate (10). In this case, although the heavy reactor (16) is mounted on the first substrate (10), damage caused by the strain of the first chip part (11) can be reduced as compared with the case where the strain of the first chip part (11) in the connected state exceeds 4000 μST.

TABLE 1

| Type of part | Size | Numerical range |
|---|---|---|
| Chip capacitor | Smaller than 0.89 mm² | 500 μST to 1200 μST |
| | 0.89 mm² or more | 1000 μST to 2500 μST |
| Chip inductor | Any size | 1000 μST to 2500 μST |
| Chip resistor | Any size | 1500 μST to 4000 μST |

When the predetermined value is within the numerical range shown in Table 1, and the first chip part (11) is a chip capacitor having a size smaller than 0.89 mm², the strain of the first chip part (11) is equal to or more than a first predetermined value which is from 500 μST to 1200 μST inclusive in the non-connected state. In this case, the strain of the first chip part (11) is equal to or less than the first predetermined value in the connected state. Thus, damage to the first chip part (11) due to the strain can be reduced as compared with the case where the strain of the first chip part (11) exceeds 1200 μST in the connected state.

When the first chip part (11) is a chip capacitor having a size of 0.89 mm² or more, the strain of the first chip part (11) is equal to or more than a second predetermined value which is from 1000 μST to 2500 μST inclusive in the non-connected state. In this case, the strain of the first chip part (11) is equal to or less than the second predetermined value in the connected state. Thus, as compared with the case where the strain of the first chip part (11) exceeds 2500 μST in the connected state, damage to the first chip part (11) due to the strain can be reduced.

When the first chip part (11) is a chip inductor, the strain of the first chip part (11) is equal to or more than a third predetermined value which is from 1000 μST to 2500 μST inclusive in the non-connected state. In this case, the strain of the first chip part (11) is equal to or less than the third predetermined value in the connected state. Thus, as compared with the case where the strain of the first chip part (11) exceeds 2500 μST in the connected state, damage to the first chip part (11) due to the strain can be reduced.

When the first chip part (11) is a chip resistor, the strain of the first chip part (11) is equal to or more than a fourth predetermined value which is from 1500 μST to 4000 μST inclusive in the non-connected state. In this case, the strain of the first chip part (11) is equal to or less than the fourth predetermined value in the connected state. Thus, as compared with the case where the strain of the first chip part (11) exceeds 4000 μST in the connected state, damage to the first chip part (11) due to the strain can be reduced.

More preferably, the predetermined value is within the numerical range shown in Table 2 below, i.e., from 500 μST to 2000 μST, depending on the type and size of the first chip part (11). In this case, although the heavy reactor (16) is mounted on the first substrate (10), damage caused by the strain of the first chip part (11) can be reduced as compared with the case where the strain of the first chip part (11) in the connected state exceeds 2000 μST.

TABLE 2

| Type of part | Size | Numerical range |
| --- | --- | --- |
| Chip capacitor | Smaller than 0.89 mm² | 500 μST to 650 μST |
| | 0.89 mm² or more | 1000 μST to 1300 μST |
| Chip inductor | Any size | 1000 μST to 1300 μST |
| Chip resistor | Any size | 1500 μST to 2000 μST |

When the predetermined value is within the numerical range shown in Table 2, and the first chip part (11) is a chip capacitor having a size smaller than 0.89 mm², the strain of the first chip part (11) is equal to or more than a fifth predetermined value which is from 500 μST to 650 μST inclusive in the non-connected state. In this case, the strain of the first chip part (11) is equal to or less than the fifth predetermined value in the connected state. Thus, as compared with the case where the strain of the first chip part (11) exceeds 650 μST in the connected state, damage caused by the strain of the first chip part (11) can be reduced.

When the first chip part (11) is a chip capacitor having a size equal to or more than 0.89 mm², the strain of the first chip part (11) is equal to or more than a sixth predetermined value which is from 1000 μST to 1300 μST inclusive in the non-connected state. In this case, the strain of the first chip part (11) is equal to or less than the sixth predetermined value in the connected state. Thus, as compared with the case where the strain of the first chip part (11) exceeds 1300 μST in the connected state, damage caused by the strain of the first chip part (11) can be reduced.

When the first chip part (11) is a chip inductor, the strain of the first chip part (11) is equal to or more than a seventh predetermined value which is from 1000 μST to 1300 μST in the non-connected state. In this case, the strain of the first chip part (11) is equal to or less than the seventh predetermined value in the connected state. Thus, as compared with the case where the strain of the first chip part (11) exceeds 1300 μST in the connected state, damage caused by the strain of the first chip part (11) can be reduced.

When the first chip part (11) is a chip resistor, the strain of the first chip part (11) is equal to or more than an eighth predetermined value which is from 1500 μST to 2000 μST inclusive in the non-connected state. In this case, the strain of the first chip part (11) is equal to or less than the eighth predetermined value in the connected state. Thus, as compared with the case where the strain of the first chip part (11) exceeds 2000 μST in the connected state, damage caused by the strain of the first chip part (11) can be reduced.

The condition that the size of the first chip part (11) is less than 0.89 mm² is met by, for example, chips of sizes 0402, 0603, and 1005 according to the JIS standard and sizes 01005, 0201, and 0402 according to the Electronic Industries Alliance (EIA) standard.

The condition that the size of the first chip part (11) is equal to or more than 0.89 mm² is met by, for example, chips of sizes 1608, 2012, 3216, 3225, 5025, and 6432 according to the JIS standard and sizes 0603, 0805, 1206, 1210, 2010, and 2512 according to the EIA standard.

The size of the first chip part (11) is not limited to those according to the above-mentioned standards.

According to this embodiment, when the second substrate (20) is connected to the first substrate (10), the strain of the first chip part (11) with the first substrate (10) supported at the two predetermined points (30a, 30b) is reduced as compared with the case where the second substrate (20) is not connected to the first substrate (10). This can avoid damage to the first chip part (11) without providing a reinforcing part separately from the first and second substrates (10, 20). Thus, the parts count, manufacturing cost, and weight of the substrate structure can be reduced as compared with the case where a reinforcing part is provided separately from the substrates (10, 20).

The first and second substrates (10, 20) are parallel to each other, and at least part of the second substrate (20) overlaps with at least part of the first substrate (10) and is connected to the first substrate (10) via the connecting parts (15a to 15c). This can reduce the distortion of the first substrate (10) and allows easy provision of three or more connecting parts (15a to 15c).

With the two or more connecting parts (15a to 15c) thus provided, the second substrate (20) can be stably connected to the first substrate (10), the first substrate (10) can be supported by the second substrate (20), and in particular, the distortion of part of the first substrate (10) sandwiched between the two or more connecting parts (15a to 15c) can be reduced.

The distance (D) between two connecting parts (15a and 15c) of the three connecting parts (15a to 15c) that are most distant from each other is set equal to or more than one third of the length (L) of the longest linear edge of the first substrate (10). This can reduce the distortion of the first substrate (10) in a greater range as compared with the case where the distance (D) is less than one third of the longest linear edge (L).

The connecting parts (15a to 15c) are electrically connected to the second substrate (20). This requires no other part than the connecting parts (15a to 15c) for electrically connecting the substrates (10, 20) to each other, reducing the parts count.

The connecting parts (15a to 15c) are connected to the second substrate (20) by screwing, soldering, or press fitting with the press fitting member (P), allowing easy connection of the connecting parts (15a to 15c) to the second substrate (20).

The inverter circuit (14) is electrically connected to the capacitor (21) via the first to third connecting parts (15a to 15c). This can easily shorten the wire connecting the capacitor (21) and the inverter circuit (14) although the capacitor (21) is large in size.

In this embodiment, a single first chip part (11) has a strain equal to or more than a predetermined value which is from 500 μST to 4000 μST inclusive in the non-connected state, and the strain of the single first chip part (11) is set equal to or less than the predetermined value in the connected state. When multiple first chip parts (11) that are at least different in type or size are mounted on the first substrate (10), the strain of each of the first chip parts (11) may be equal to or more than the predetermined value corresponding to the single first chip part (11) in the non-connected state, and the predetermined value corresponding to each of the first chip parts (11) may be within the numerical range shown in Table 1 or 2 depending on the type and size of each first chip part (11).

In this embodiment, the connecting parts (15a to 15c) are mounted on the first substrate (10) and electrically and physically connected to the second substrate (20). Reversely, the connecting parts (15a to 15c) may be mounted on the second substrate (20) and electrically and physically connected to the first substrate (10). That is, the connecting parts (15a to 15c) may be mounted on one of the first and second substrates (10) and connected to the other substrate.

Each of the first and second substrates (10, 20) may have a shape other than a rectangular shape in plan view. For example, the substrates may have a rectangular shape partially cut out in plan view. The long side of the second substrate (20) may be longer than the long side of the first substrate (10), or the short side of the second substrate (20) may be longer than the short side of the first substrate (10).

The first and second substrates (10, 20) may not be parallel to each other. For example, the first and second substrates (10, 20) may be arranged orthogonal to each As can be seen in the foregoing description, the present disclosure is useful for a substrate structure including a first substrate with chip parts mounted and a second substrate connected to the first substrate.

The invention claimed is:

1. A substrate structure, comprising:
a first substrate with a plurality of chip parts including a first chip part mounted; and
a second substrate connected to the first substrate,
the first chip part having a strain equal to or more than a predetermined value, which is from 500 μST to 4000 μST, in a non-connected state in which the second substrate is not connected to the first substrate and the first substrate is supported at two predetermined points,
the strain of the first chip part being equal to or less than the predetermined value in a connected state in which the second substrate is connected to the first substrate and the first substrate is supported at the two predetermined points.

2. The substrate structure of claim 1, wherein the predetermined value is from 500 μST to 2000 μST.

3. The substrate structure of claim 2, wherein the predetermined value is within a numerical range shown in Table 2 below depending on a type and size of the first chip part

TABLE 2

| Type of part | Size | Numerical range |
| --- | --- | --- |
| Chip capacitor | Smaller than 0.89 mm² | 500 μST to 650 μST |
| | 0.89 mm² or more | 1000 μST to 1300 μST |

TABLE 2-continued

| Type of part | Size | Numerical range |
| --- | --- | --- |
| Chip inductor | Any size | 1000 μST to 1300 μST |
| Chip resistor | Any size | 1500 μST to 2000 μST. |

4. The substrate structure of claim 2, wherein the predetermined value depends on a type and size of the first chip part.

5. The substrate structure of claim 2, wherein the first and second substrates are parallel to each other.

6. The substrate structure of claim 2, wherein the substrate structure meets at least one of
a condition that a tensile modulus of elasticity of the second substrate in a first predetermined direction is 70% or more of a tensile modulus of elasticity of the first substrate in a second predetermined direction, and
a condition that a bending modulus of elasticity of the second substrate in a third predetermined direction is 70% or more of a bending modulus of elasticity of the first substrate in a fourth predetermined direction.

7. The substrate structure of claim 2, wherein
the first and second substrates are connected via two or more connecting parts arranged at intervals, and
each of the connecting parts is mounted on the first substrate or the second substrate.

8. The substrate structure of claim 1, wherein
the predetermined value depends on a type and size of the first chip part.

9. The substrate structure of claim 8, wherein the first and second substrates are parallel to each other.

10. The substrate structure of claim 8, wherein the substrate structure meets at least one of
a condition that a tensile modulus of elasticity of the second substrate in a first predetermined direction is 70% or more of a tensile modulus of elasticity of the first substrate in a second predetermined direction, and
a condition that a bending modulus of elasticity of the second substrate in a third predetermined direction is 70% or more of a bending modulus of elasticity of the first substrate in a fourth predetermined direction.

11. The substrate structure of claim 8, wherein
the first and second substrates are connected via two or more connecting parts arranged at intervals, and
each of the connecting parts is mounted on the first substrate or the second substrate.

12. The substrate structure of claim 1, wherein
the predetermined value is within a numerical range shown in Table 1 below depending on a type and size of the first chip part

TABLE 1

| Type of part | Size | Numerical range |
| --- | --- | --- |
| Chip capacitor | Smaller than 0.89 mm² | 500 μST to 1200 μST |
| | 0.89 mm² or more | 1000 μST to 2500 μST |
| Chip inductor | Any size | 1000 μST to 2500 μST |
| Chip resistor | Any size | 1500 μST to 4000 μST. |

13. The substrate structure of claim 1, wherein the first and second substrates are parallel to each other.

14. The substrate structure of claim 1, wherein the substrate structure meets at least one of a condition that a tensile modulus of elasticity of the second substrate in a first predetermined direction is 70% or more of a tensile modulus of elasticity of the first substrate in a second predetermined direction, and a condition that a bending modulus of elasticity of the second substrate in a third predetermined direction is 70% or more of a bending modulus of elasticity of the first substrate in a fourth predetermined direction.

15. The substrate structure of claim 14, wherein a difference between a coefficient of linear expansion of the first substrate in a fifth predetermined direction and a coefficient of linear expansion of the second substrate in a sixth predetermined direction is 30 ppm/K or less.

16. The substrate structure of claim 1, wherein the first and second substrates are connected via two or more connecting parts arranged at intervals, and each of the connecting parts is mounted on the first substrate or the second substrate.

17. The substrate structure of claim 16, wherein at least some of the two or more connecting parts are spaced from each other by a distance of one third or more of a length of a longest linear edge of the first substrate.

18. The substrate structure of claim 16, wherein each of the connecting parts is electrically connected to the substrate different from the substrate on which the connecting parts are mounted.

19. The substrate structure of claim 18, wherein each of the connecting parts is made of a conductive material and connected by screwing, soldering, or press fitting with a press fitting member to the substrate different from the substrate on which the connecting parts are mounted.

20. The substrate structure of claim 18, wherein a converter circuit configured to convert AC power from a power source into DC power and an inverter circuit configured to convert the DC power into AC power are mounted on the first substrate, a capacitor connected between output terminals of the converter circuit or between input terminals of the inverter circuit is through-hole mounted on the second substrate, and the inverter circuit is electrically connected to the capacitor via the connecting parts.

\* \* \* \* \*